(12) United States Patent
Pei

(10) Patent No.: US 8,211,320 B2
(45) Date of Patent: Jul. 3, 2012

(54) CARBON NANOTUBE DEVICE AND METHOD FOR MAKING SAME

(75) Inventor: Shao-Kai Pei, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 112 days.

(21) Appl. No.: 12/821,146

(22) Filed: Jun. 23, 2010

(65) Prior Publication Data

US 2011/0177307 A1    Jul. 21, 2011

(51) Int. Cl.
*C25F 3/00* (2006.01)

(52) U.S. Cl. ............... 216/11; 216/39; 216/97; 216/99; 977/742

(58) Field of Classification Search ............. 216/11, 216/39, 97, 99; 977/742
See application file for complete search history.

(56) References Cited

U.S. PATENT DOCUMENTS

| | | | | |
|---|---|---|---|---|
| 6,097,138 | A * | 8/2000 | Nakamoto | 313/309 |
| 7,150,801 | B2 * | 12/2006 | Fujii et al. | 156/234 |
| 7,534,648 | B2 * | 5/2009 | Raravikar et al. | 438/99 |
| 2004/0231781 | A1 * | 11/2004 | Bao et al. | 156/230 |
| 2005/0072509 | A1 * | 4/2005 | Full et al. | 156/57 |
| 2005/0263388 | A1 * | 12/2005 | Lee et al. | 204/192.1 |
| 2006/0220198 | A1 * | 10/2006 | Baskaran | 257/678 |
| 2010/0075024 | A1 * | 3/2010 | Ajayan et al. | 427/66 |
| 2010/0253375 | A1 * | 10/2010 | Fang et al. | 324/754 |

* cited by examiner

*Primary Examiner* — Binh X Tran
(74) *Attorney, Agent, or Firm* — Altis Law Group, Inc.

(57) ABSTRACT

A carbon nanotube device includes a flexible substrate and a patterned carbon nanotube layer. The flexible substrate defines a plurality of recesses. The patterned carbon nanotube layer is formed on the flexible substrate. The carbon nanotube layer includes a plurality of carbon nanotube arrays. Each carbon nanotube array is fixedly attached in the corresponding recess.

8 Claims, 4 Drawing Sheets

CARBON NANOTUBE DEVICE AND METHOD FOR MAKING SAME

BACKGROUND

1. Technical Field

The present disclosure relates to carbon nanotube devices and methods for making the same.

2. Description of Related Art

Carbon nanotubes are typically manufactured by a chemical vapour deposition (CVD) method. A rigid substrate with catalysts, such as a silicon substrate, is used for growing the carbon nanotubes in the CVD method. However, using a rigid substrate may be a restriction for various applications of the carbon nanotubes.

Therefore, a carbon nanotube device and a method for making the same, which can overcome the above-mentioned problems, is needed.

DETAILED DESCRIPTION

Figure 1:
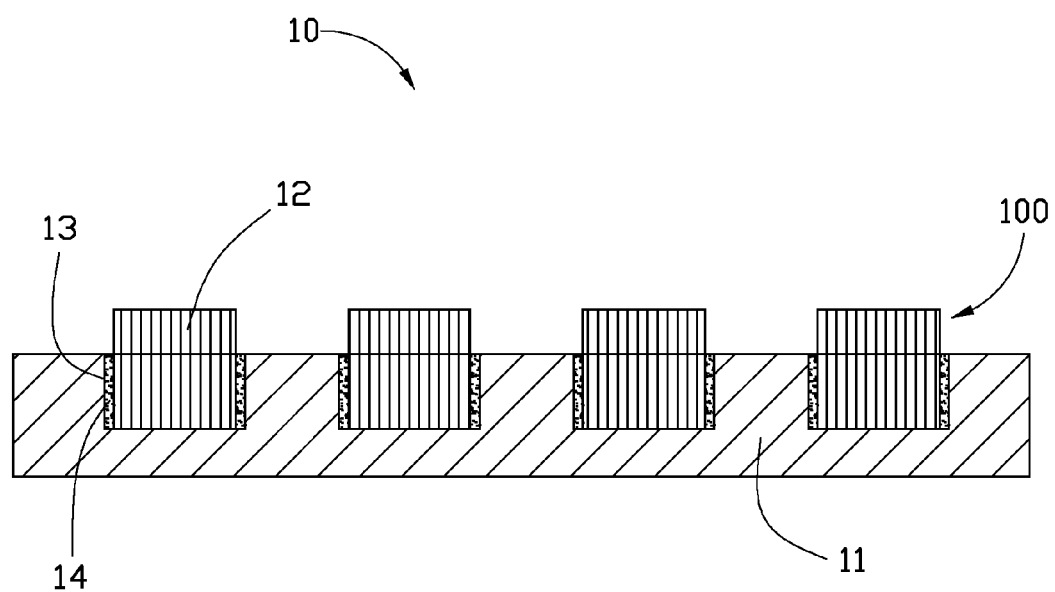
FIG. 1 is a sectional view of a carbon nanotube device, according to a first embodiment.

Referring to FIG. 1, a carbon nanotube device 10, according to a first embodiment, includes a flexible substrate 11, and a patterned carbon nanotube layer 100.

The flexible substrate 11 is made of polyethylene terephthalate in this embodiment and defines a plurality of recesses 13. The plurality of recesses 13 form a predetermined pattern on the flexible substrate 11. It is noteworthy that in alternative embodiments, any suitable material for the flexible substrate 11 may be used.

The patterned carbon nanotube layer 100 includes a plurality of carbon nanotube arrays 12. Each carbon nanotube array 12 is fixedly attached in the corresponding recess 13 using an adhesive 14. Therefore, the patterned carbon nanotube layer 100 is formed.

Figure 2:
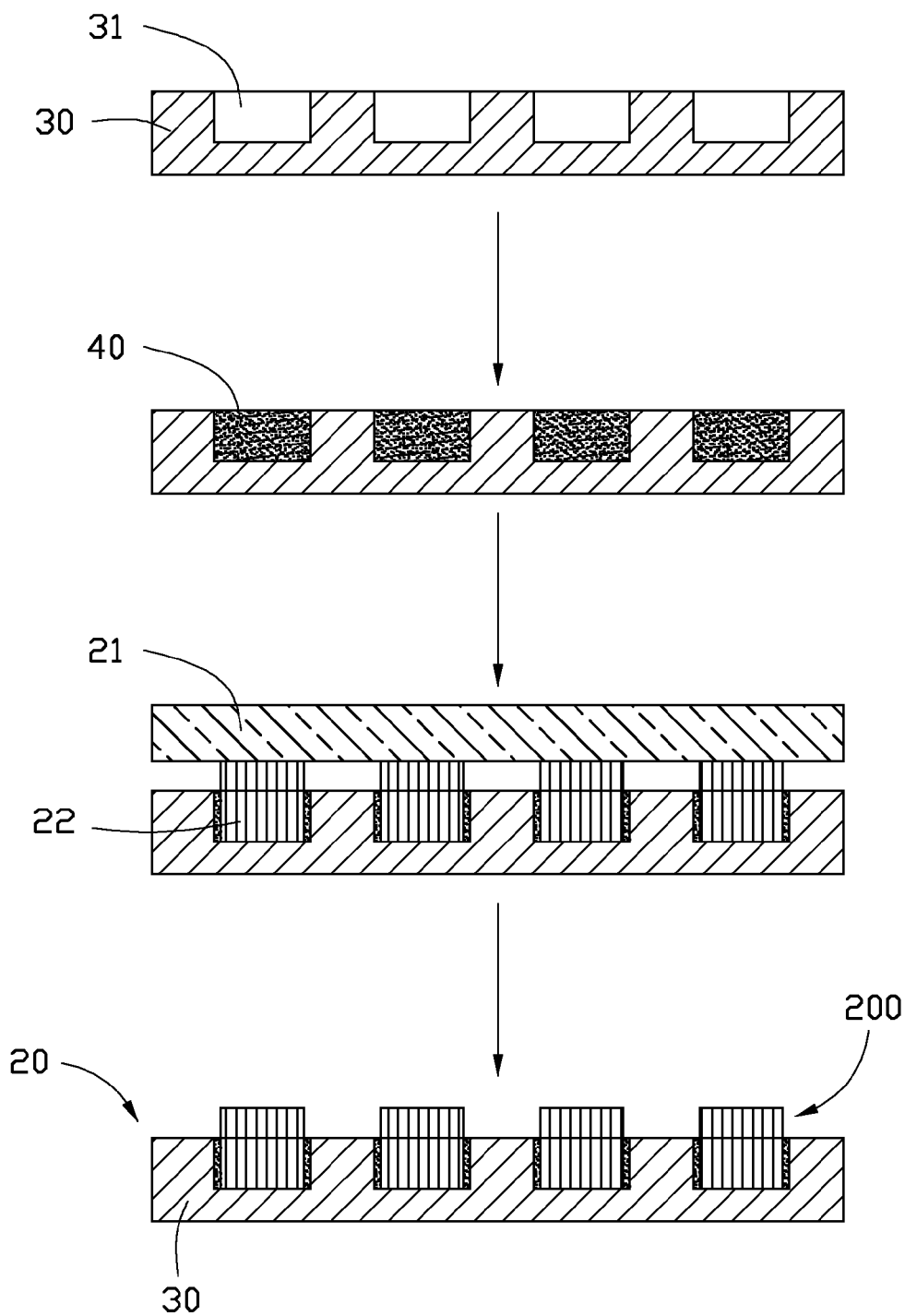
FIG. 2 is a schematic view of a method for making a carbon nanotube device, according to a second embodiment.

Referring to FIG. 2, a method for making a carbon nanotube device 20 is shown. The method includes steps S100 through S110. Step S100: a rigid substrate 21 is provided with a plurality of carbon nanotube arrays 22 grown thereon. Step S102: a flexible substrate 30 is provided with a plurality of recesses 31 defined therein. Step S104: a curable adhesive 40 is applied in each recess 31. Step S106: the rigid substrate 21 is attached to the flexible substrate 30 with the plurality of carbon nanotube arrays 22 in contact with the curable adhesives 40. Step S108: the curable adhesives 40 are cured to fix the carbon nanotube arrays 22 in the recesses 31. Step S110: the rigid substrate 21 is removed, thereby obtaining the carbon nanotube device 20.

In the step S100, the rigid substrate 20 may be a substrate suitable for growing the carbon nanotube arrays 22, such as a P-type silicon wafer, an N-type silicon wafer, a silicon wafer with a film of silicon dioxide thereon or a glass substrate. In this embodiment, a process for growing the carbon nanotube arrays 22 on the rigid substrate 21 is a chemical vapor deposition (CVD) process. The carbon nanotube arrays 22 are super-aligned carbon nanotubes arrays in this method. The method for making the super-aligned carbon nanotube arrays 22 on the rigid substrate 21 includes the following sub-steps: (a11) providing a substantially flat and smooth substrate 21. Then (a12) catalyst layers are formed on the rigid substrate 21. Next (a13) the rigid substrate 21 with the catalyst layers thereon is annealed at a temperature ranging from about 700° C. to about 900° C. in air for about 30 to 90 minutes. After that (a14) the rigid substrate 21 with the catalyst layers is heated at a temperature ranging from about 500° C. to about 740° C. in a furnace with a protective gas therein. In addition (a15) a carbon source gas is introduced into the furnace for about 5 to about 30 minutes, and growing the super-aligned carbon nanotube arrays 22 from the rigid substrate 21.

In step (a11), the rigid substrate 21 can be a P-type silicon wafer, an N-type silicon wafer, a silicon wafer with a film of silicon dioxide thereon or a glass substrate. In this method, the rigid substrate 21 is a P-type silicon wafer of the present example.

In step (a12), the catalyst layers can be made of iron (Fe), cobalt (Co), nickel (Ni), or an alloy thereof. The catalyst layers may be formed on the rigid substrate 21 in a predetermined pattern, such as arranging the catalyst layers in arrays.

In step (a14), the protective gas can be made up of at least one of nitrogen ($N_2$), ammonia ($NH_3$), or a noble gas. In the step (a15), the carbon source gas can be a hydrocarbon gas, such as ethylene ($C_2H_4$), methane ($CH_4$), acetylene ($C_2H_2$), ethane ($C_2H_6$), or any combination thereof.

The super-aligned carbon nanotube arrays 22 can be about 200 to about 400 microns in height and includes a plurality of carbon nanotubes substantially parallel to each other and substantially perpendicular to the rigid substrate 21. The super-aligned carbon nanotube arrays 22 formed under the above conditions are essentially free of impurities, such as carbonaceous or residual catalyst particles. The carbon nanotubes in the super-aligned carbon nanotube arrays 22 are packed closely together by van der Waals attractive force.

In step S102, the flexible substrate 30 is made of polyethylene terephthalate in this embodiment. The plurality of recesses 31 may be formed using a laser irradiation patterning process (laser beam), a chemical etching process, a physical etching process or a molding process. The pattern of the recesses 31 coincides with the pattern of the carbon nanotube arrays 22. It is noteworthy that the step S102 may be performed before the step S100, and the step S104 may be performed before the step S100 in alternative embodiments.

In step S104, the curable adhesive 40 may be a light-curable adhesive and can be cured by a ultraviolet light for example. In addition, the curable adhesive 40 may be a heat-curable adhesive in alternative embodiments. In the step S106, the rigid substrate 21 is attached to the flexible substrate 30 and the carbon nanotube arrays 22 are in contact with the adhesives 40. Portions of the carbon nanotube arrays 22 are buried in the adhesives 40.

In step S108, the adhesives 40 are cured to fix the carbon nanotube arrays 22 in the recesses 31 on the flexible substrate 30. If an ultraviolet light cures the curable adhesives 40, at least one of the rigid substrates 21 or the flexible substrate 30 is transparent for allowing the ultraviolet light to pass through. In step S110, the rigid substrate 21 is removed using a hydrofluoric acid solution. Therefore, a patterned carbon nanotube layer 200 on the flexible substrate 30 is obtained. It is noteworthy that, other suitable means, for removing the rigid substrate 21 may be used as long as the carbon nanotube arrays 22 are kept from damage.

Since the carbon nanotube arrays can be fixedly attached to the flexible substrate, the carbon nanotube device can be used more widely.

Figure 3:
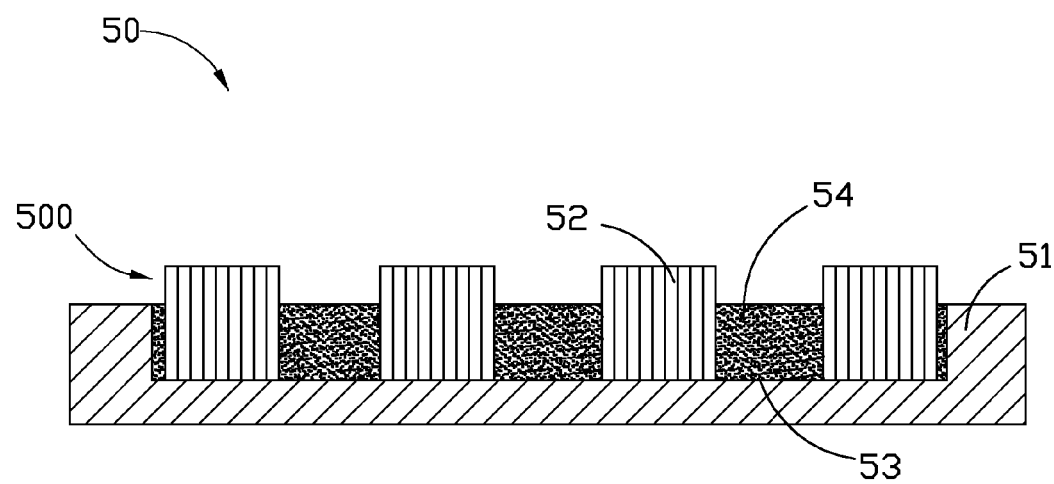
FIG. 3 is a sectional view of a carbon nanotube device, according to a third embodiment.
Figure 4:
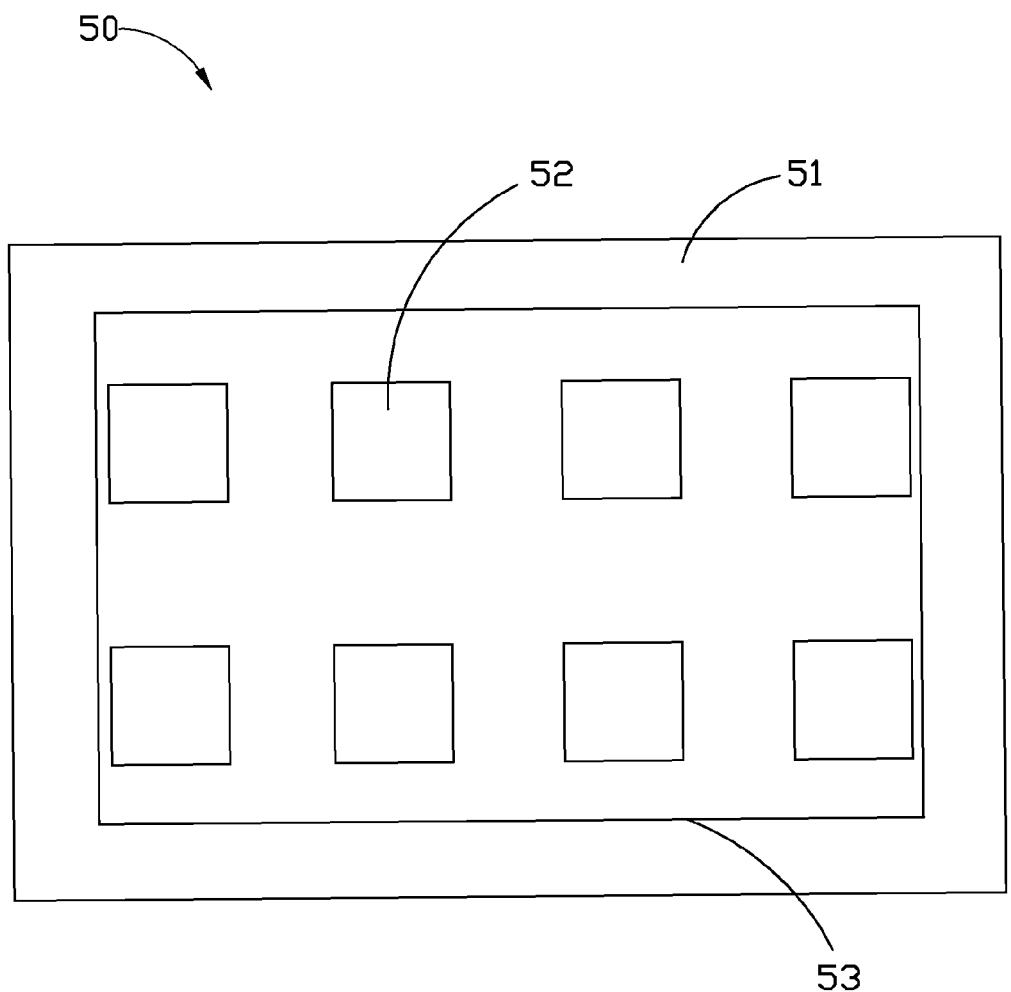
FIG. 4 is a top view of the carbon nanotube device of FIG. 3.

Referring to FIGS. 3 and 4, a carbon nanotube device 50, according to a third embodiment, includes a flexible substrate 51, and a patterned carbon nanotube layer 500.

The flexible substrate 51 is made of polyethylene terephthalate in this embodiment and defines a recess 53. The patterned carbon nanotube layer 500 includes a plurality of carbon nanotube arrays 52. The plurality of carbon nanotube arrays 52 are fixedly attached in the recess 53 using an adhesive 54. The carbon nanotube pattern may be predetermined in a method for growing the carbon nanotube arrays 52 on a rigid substrate. It is noteworthy that a method for making the carbon nanotube device 50 is similar to the method for making the carbon nanotube device 20.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method for making a carbon nanotube device, comprising:
    providing a rigid substrate with a plurality of carbon nanotube arrays grown thereon, the carbon nanotube arrays arranged in a predetermined pattern;
    providing a flexible substrate with a plurality of recesses defined therein;
    applying a curable adhesive in each recess;
    attaching the rigid substrate to the flexible substrate with the plurality of carbon nanotube arrays in contact with the curable adhesives;
    curing the curable adhesives to fix the carbon nanotube arrays in the recesses; and
    removing the rigid substrate, thereby obtaining the carbon nanotube device.

2. The method of claim 1, wherein the recesses are formed using a laser beam.

3. The method of claim 1, wherein the carbon nanotube array is a super-aligned carbon nanotube array.

4. The method of claim 1, wherein the rigid substrate is a glass substrate.

5. The method of claim 1, wherein the curable adhesive is a light-curable adhesive or a heat-curable adhesive.

6. The method of claim 5, wherein the flexible substrate is transparent.

7. The method of claim 1, wherein the rigid substrate is a silicon wafer.

8. The method of claim 7, wherein the rigid substrate is removed using a hydrofluoric acid solution.

* * * * *